(12) United States Patent
Chiu et al.

(10) Patent No.: US 11,270,891 B2
(45) Date of Patent: Mar. 8, 2022

(54) METHOD FOR MAKING SELF-ALIGNED DOUBLE PATTERN

(71) Applicant: Shanghai Huali Integrated Circuit Corporation, Shanghai (CN)

(72) Inventors: Yenchan Chiu, Shanghai (CN); Yingju Chen, Shanghai (CN); Liyao Liu, Shanghai (CN); Chanyuan Hu, Shanghai (CN)

(73) Assignee: Shanghai Huali Integrated Circuit Corporation, Shanghai (CN)

( * ) Notice: Subject to any disclaimer, the term of this patent is extended or adjusted under 35 U.S.C. 154(b) by 0 days.

(21) Appl. No.: 16/997,504

(22) Filed: Aug. 19, 2020

(65) Prior Publication Data

US 2021/0391183 A1 Dec. 16, 2021

(30) Foreign Application Priority Data

Jun. 10, 2020 (CN) .......................... 202010521377.7

(51) Int. Cl.
*H01L 21/308* (2006.01)
*H01L 29/66* (2006.01)

(52) U.S. Cl.
CPC ...... *H01L 21/3088* (2013.01); *H01L 21/3081* (2013.01); *H01L 21/3085* (2013.01); *H01L 21/3086* (2013.01); *H01L 29/66795* (2013.01)

(58) Field of Classification Search
None
See application file for complete search history.

(56) References Cited

U.S. PATENT DOCUMENTS

| | | | |
|---|---|---|---|
| 8,039,326 B2* | 10/2011 | Knorr | H01L 29/7851 438/157 |
| 8,940,602 B2* | 1/2015 | Basker | H01L 21/762 438/249 |
| 10,181,426 B1* | 1/2019 | Ching | H01L 29/42368 |
| 2004/0150029 A1* | 8/2004 | Lee | H01L 29/7851 257/308 |
| 2018/0350969 A1* | 12/2018 | Ching | H01L 21/823431 |
| 2019/0164840 A1* | 5/2019 | Ching | H01L 21/823462 |
| 2019/0164841 A1* | 5/2019 | St. Amour | H01L 21/28568 |
| 2020/0176329 A1* | 6/2020 | Chang | H01L 29/66795 |
| 2021/0036127 A1* | 2/2021 | Lin | H01L 29/0847 |

* cited by examiner

*Primary Examiner* — Allan W. Olsen
(74) *Attorney, Agent, or Firm* — Banner & Witcoff, Ltd.

(57) ABSTRACT

The disclosure provides a method for making a self-aligned double pattern, A silicon substrate with a first oxide layer, an amorphous silicon layer and an organic layer, etching the organic layer and the amorphous silicon layer, and covering them with a first silicon nitride layer; remove the first silicon nitride layer in the amorphous silicon pattern, forming first silicon nitride sidewall patterns on the amorphous silicon pattern's sidewalls; removing the amorphous silicon pattern between the first silicon nitride sidewall patterns; defining the morphology of a fin field-effect transistor, form core patterns and covering them with a thin silicon nitride layer; depositing a second oxide layer; defining the fin field-effect transistor's height, and etching back the second oxide layer till the height of the core patterns satisfies the defined fin field-effect transistor height; removing the thin silicon nitride layer, depositing a third oxide layer to cover the core patterns.

9 Claims, 12 Drawing Sheets

METHOD FOR MAKING SELF-ALIGNED DOUBLE PATTERN

CROSS-REFERENCES TO RELATED APPLICATIONS

This application claims priority to Chinese Patent Application No. CN 202010521377.7, filed on Jun. 10, 2020, and entitled "Method for Making Self-Aligned Double Pattern," the disclosure of which is incorporated herein by reference in entirety.

TECHNICAL FIELD

The disclosure relates to the field of semiconductor technology, and in particular to a method for making a self-aligned double pattern.

BACKGROUND

The general flow of a fin field-effect transistor logic chip process in the prior art includes the following steps (refer to FIG. 1 to FIG. 13): 1. forming a first oxide layer 02, a silicon nitride hard mask layer A, a silicon oxide hard mask layer B, an amorphous silicon layer 03 and an organic layer 04 on a silicon substrate 01; 2. forming a photoresist pattern 05 on the organic layer; 3. etching the organic layer and the amorphous silicon layer according to the photoresist pattern to form an amorphous silicon pattern 06; 4. covering the amorphous silicon pattern with a first silicon nitride layer 07; 5. etching the first silicon nitride layer 07 to expose the top of the amorphous silicon pattern; 6. removing the amorphous silicon pattern and retaining the silicon nitride layer on the sidewalls of the amorphous silicon pattern to form first silicon nitride sidewall patterns 08; 7. etching the silicon oxide hard mask layer B, the silicon nitride hard mask layer A, the first oxide layer 02 and the silicon substrate according to the first silicon nitride sidewall patterns to form core patterns 10, a first oxide layer pattern 021 on the core patterns 10, a silicon nitride hard mask pattern Aa on the first oxide layer pattern 021, and a silicon oxide hard mask pattern Bb on the silicon nitride hard mask pattern Aa; 8. depositing a thin oxide layer 110; 9. covering a second oxide layer 12 filling gaps between patterns on the silicon substrate; 10. polishing the second oxide layer to the top of the silicon nitride hard mask pattern Aa; 11. etching back the second oxide layer 12 to the top of the first oxide layer 021 to expose the silicon nitride hard mask pattern Aa; 12. removing the silicon nitride hard mask pattern; 13. defining the height of a fin field-effect transistor and etching back the second oxide layer 12 to expose a part of the core patterns of the silicon substrate; 14. depositing a third oxide layer 13 on the sidewalls and top of the exposed core patterns. In the prior art, since the height of the amorphous silicon defined by the core etching process is greater, the height of the sidewall silicon nitride is caused to be greater, which reduces the photoresist gap filling process window; and since the process flow is complex, the production efficiency is caused to be low and the production cost is increased.

Therefore, it is necessary to provide a novel method for making a self-aligned double pattern, so as to solve the above problems.

BRIEF SUMMARY

In view of the disadvantages of the prior art, the purpose of the disclosure is to provide a method for making a self-aligned double pattern to solve the problems in the prior art, due to the fact that the height of amorphous silicon defined by the core etching process is high, the height of silicon nitride on the side wall is high, the process window of photoresist gap filling is reduced, the production efficiency is low and the production cost is increased due to the complex process flow.

In order to realize the above purpose and other related purposes, the disclosure provides a method for making a self-aligned double pattern, which at least includes the following steps:

step 1: providing a silicon substrate, the silicon substrate being provided with a first oxide layer; the first oxide layer being provided with an amorphous silicon layer; and the amorphous silicon layer being provided with an organic layer;

step 2: defining the critical dimension of polysilicon by using a mask, then spin-coating photoresist on the organic layer, and forming a photoresist pattern according to the critical dimension of polysilicon;

step 3: defining the height and critical dimension of an amorphous silicon pattern, etching the organic layer and the amorphous silicon layer according to the photoresist pattern till the upper surface of the first oxide layer is exposed, and forming the amorphous silicon pattern with the defined height and critical dimension;

step 4: covering the top and sidewalls of the amorphous silicon pattern and the exposed upper surface of the first oxide layer with a first silicon nitride layer;

step 5: etching to remove the first silicon nitride layer on the top of the amorphous silicon pattern to expose the top of the amorphous silicon pattern, and forming first silicon nitride sidewall patterns on the sidewalls of the amorphous silicon pattern;

step 6: removing the amorphous silicon pattern between the first silicon nitride sidewall patterns;

step 7: defining the morphology of a fin field-effect transistor, and etching the first oxide layer and the silicon substrate along the first silicon nitride sidewall patterns to form core patterns of the silicon substrate with the defined morphology of the fin field-effect transistor and the first oxide layer pattern on the core patterns;

step 8: removing the first oxide layer pattern;

step 9: covering the core patterns with a thin silicon nitride layer;

step 10: depositing a second oxide layer covering the thin silicon nitride layer and filling gaps between the core patterns;

step 11: polishing the second oxide layer till the thin silicon nitride layer on the top of the core patterns is exposed;

step 12: defining the height of the fin field-effect transistor, and etching back the second oxide layer till the height of the exposed core patterns satisfies the defined height of the fin field-effect transistor;

step 13: removing the thin silicon nitride layer on the sidewalls and top of the exposed core patterns;

step 14: depositing a third oxide layer to cover the top and sidewalls of the exposed core patterns.

In some examples, the first oxide layer provided on the silicon substrate in step 1 is a silicon oxide layer, and a method for forming the silicon oxide layer includes oxidizing the upper surface of the silicon substrate to form the silicon oxide layer.

In some examples, a method for forming the amorphous silicon layer on the first oxide layer in step 1 includes depositing amorphous silicon on the first oxide layer to form the amorphous silicon layer.

In some examples, the photoresist pattern in step 2 includes a plurality of mutually spaced strip structures.

In some examples, the organic layer on the amorphous silicon pattern in step 3 is completely removed.

In some examples, a method for forming the first silicon nitride layer in step 4 is an atomic layer deposition method.

In some examples, a method for covering the core patterns with the thin silicon nitride layer in step 9 is an atomic layer deposition method.

In some examples, a method for depositing the second oxide layer in step 10 is a chemical vapor deposition method.

In some examples, a method for polishing the second oxide layer in step 11 is a chemical-mechanical polishing method.

In some examples, in step 13, phosphoric acid is used to remove the thin silicon nitride layer on the sidewalls and top of the exposed core patterns.

As described above, the method for making the self-aligned double pattern provided by the disclosure has the following beneficial effects: in the method for making the self-aligned double pattern provided by the disclosure, the amorphous silicon and silicon oxide hard mask with small height is defined, the self-aligned double pattern hard mask with small height is defined, the silicon nitride stop layer is deposited through atomic deposition after the fin field-effect transistor process, and the morphology of silicon oxide and amorphous silicon is used to replace the silicon oxide/silicon nitride/silicon oxide/amorphous silicon structure in the prior art, silicon nitride deposition is performed by adopting an atomic deposition technology after the fin field-effect transistor etching process to deposit a stop layer of the chemical-mechanical polishing process to replace original silicon nitride deposition as a stop layer before the core etching process, the photoresist gap filling process window is added, and the self-aligned double pattern making process is effectively simplified.

DETAILED DESCRIPTION

The embodiments of the disclosure will be described below through specific examples, and those skilled in the art can easily understand other advantages and effects of the disclosure from the content disclosed in the description. The disclosure may also be implemented or applied through other different specific embodiments, and various details in the description may also be modified or changed based on different viewpoints and applications without departing from the spirit of the disclosure.

Please refer to FIGS. 14-17, it should be noted that the drawings provided in the embodiments are only used for schematically describing the basic concept of the disclosure, thus only illustrate components related to the disclosure, and are not drawn according to the number, shape and size of the components in the actual implementation. The form, number and scale of the components may be freely changed and the layout of the components may be more complex.

Figure 1:
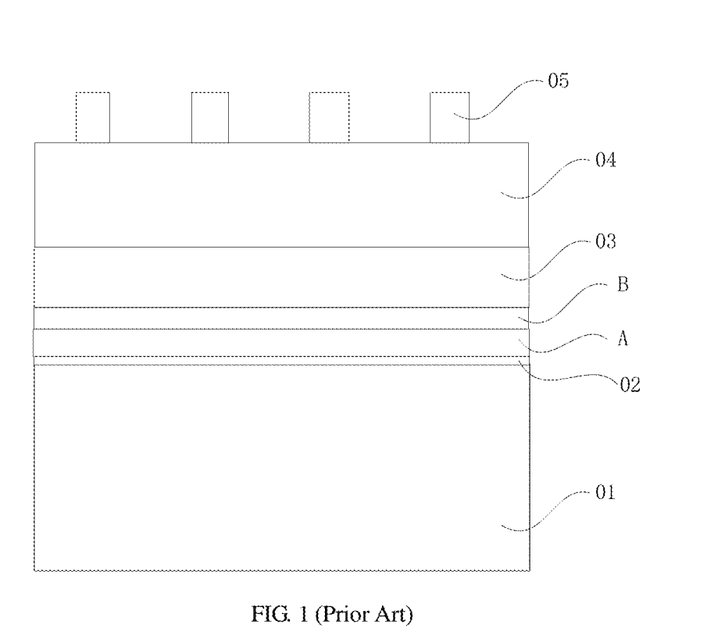
FIGs. 1-13 illustrate schematic views of structures formed in a prior art method for making a self-aligned double pattern.
Figure 2:
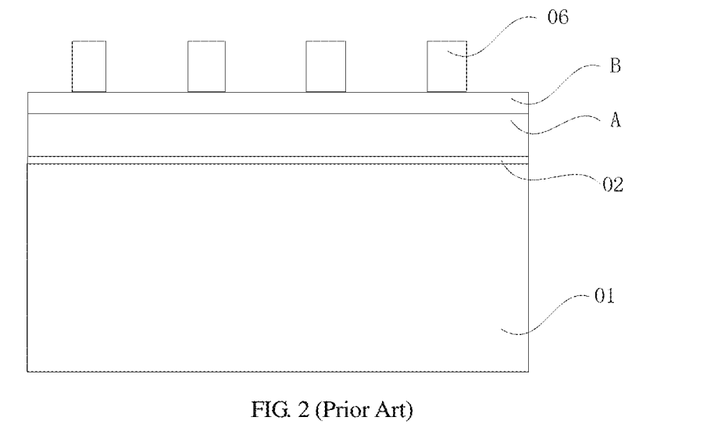
Figure 3:
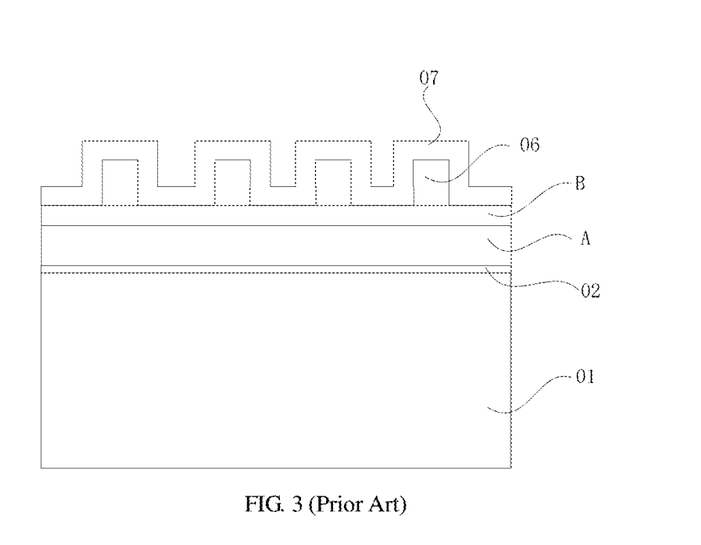
Figure 4:
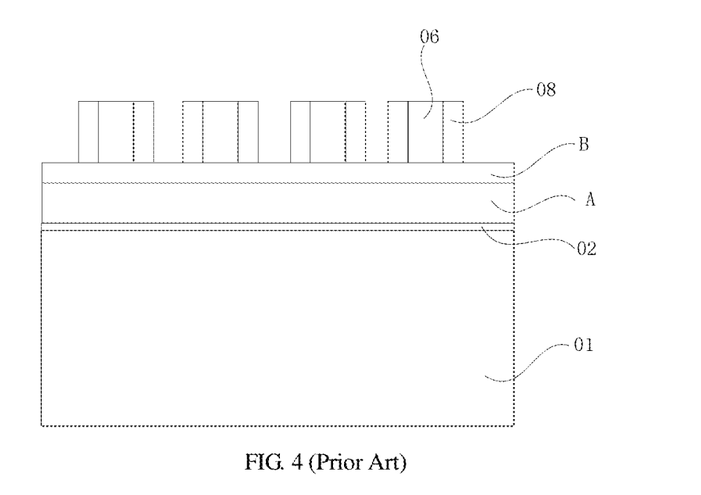
Figure 5:
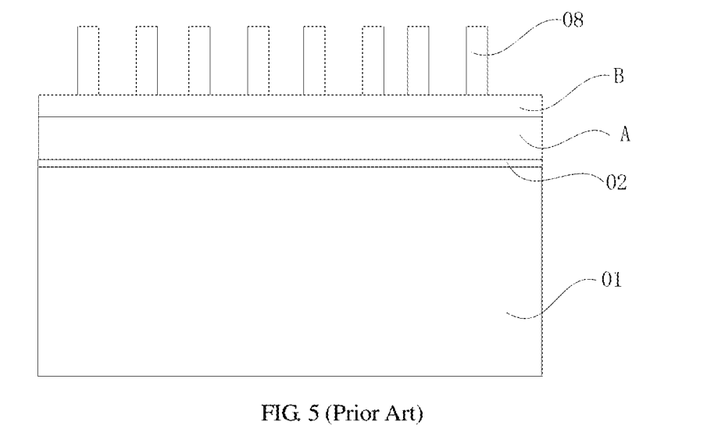
Figure 6:
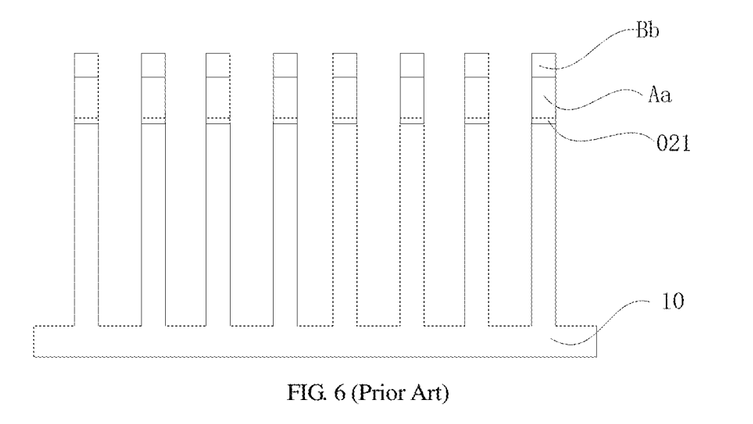
Figure 7:
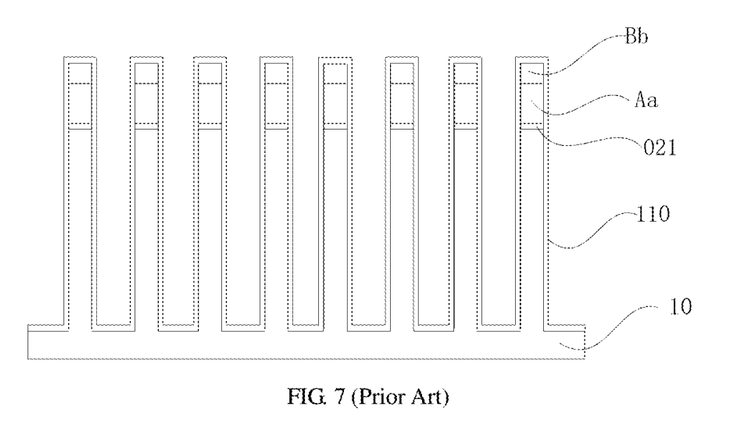
Figure 8:
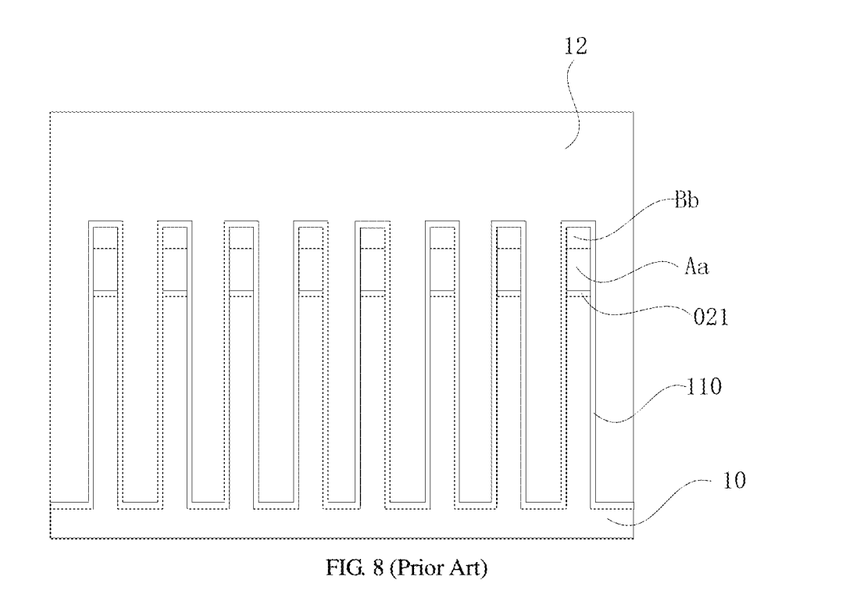
Figure 9:
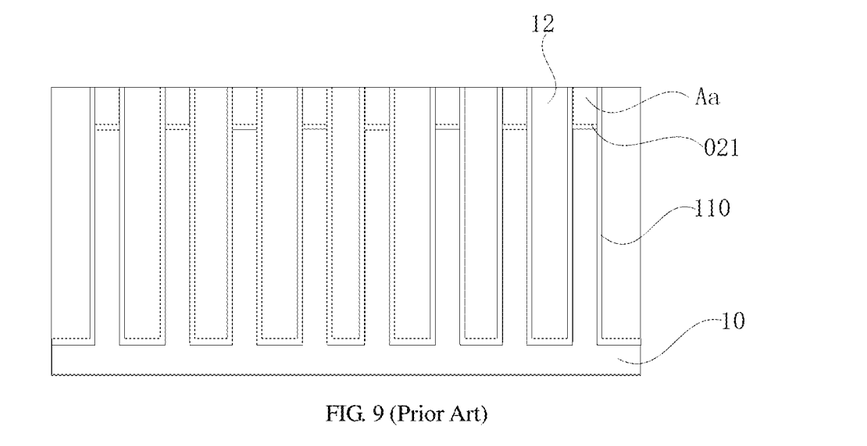
Figure 10:
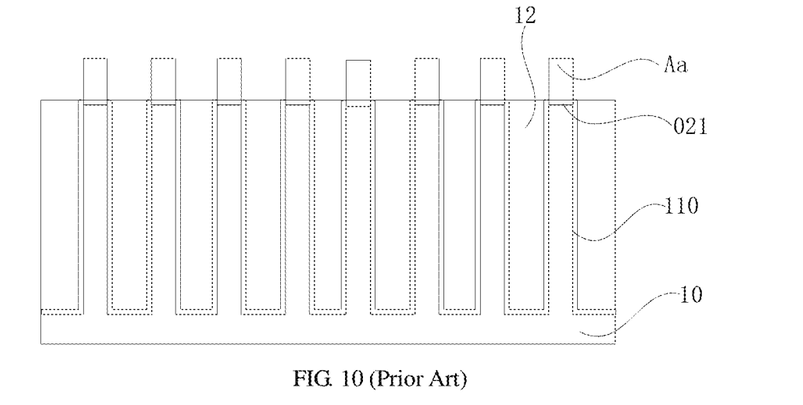
Figure 11:
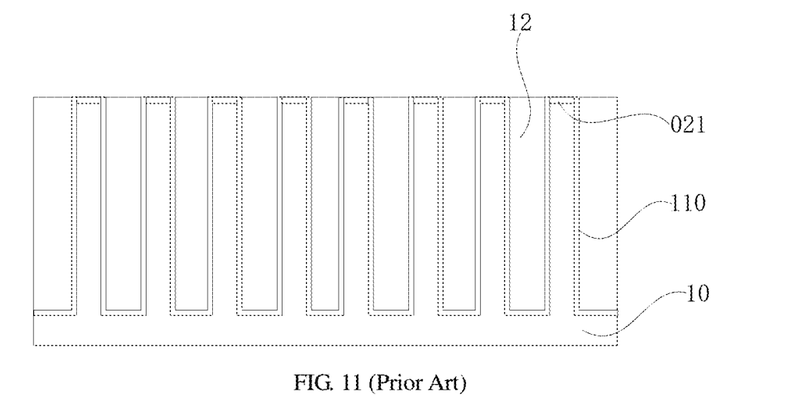
Figure 12:
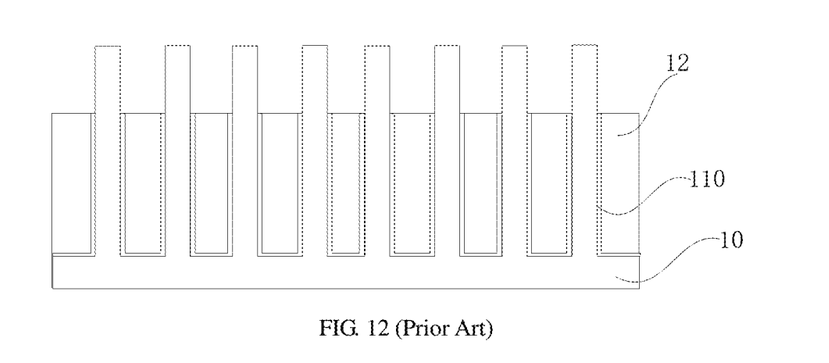
Figure 13:
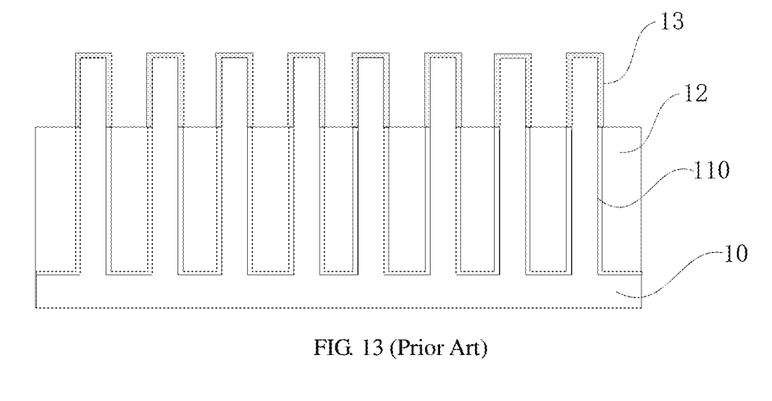
Figure 14:
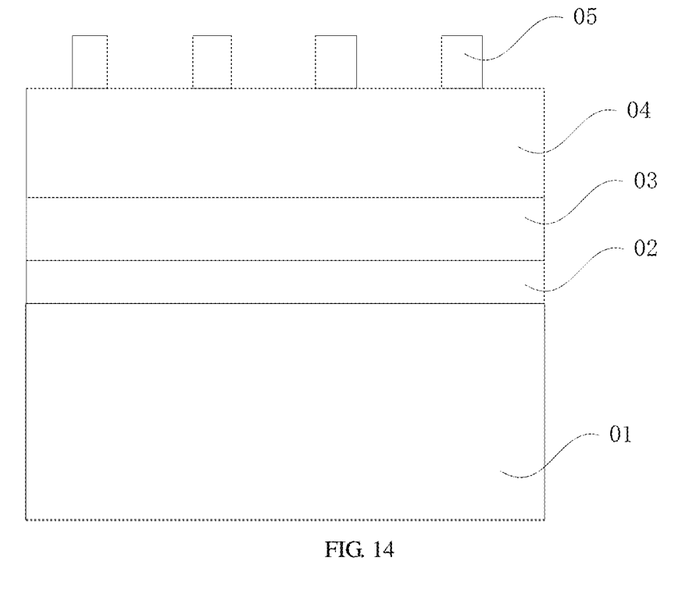
FIGS. 14-26 illustrate schematic views of structures formed in a method for making a self-aligned double pattern in the disclosure.
Figure 27:
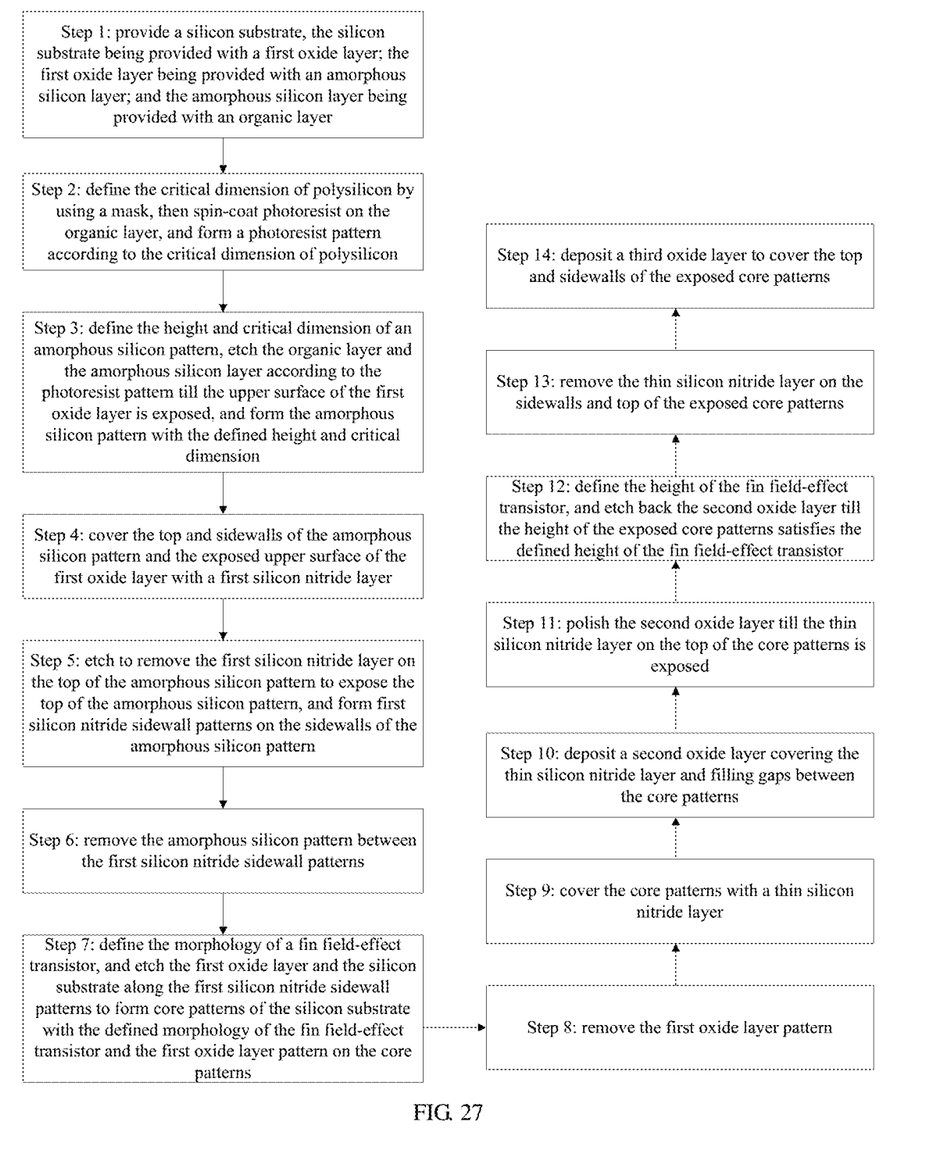
FIG. 27 illustrates a flowchart of a method for making a self-aligned double pattern according to the disclosure.

Referring to FIG. 27, it illustrates a flowchart of a method for making a self-aligned double pattern according to the disclosure. The method for making the self-aligned double pattern provided by the disclosure at least includes the following steps:

In step 1, a silicon substrate is provided. The silicon substrate is provided with a first oxide layer. The first oxide layer is provided with an amorphous silicon layer. The amorphous silicon layer is provided with an organic layer. The first oxide layer provided on the silicon substrate in step 1 is a silicon oxide layer, and a method for forming the silicon oxide layer includes oxidizing the upper surface of the silicon substrate to form the silicon oxide layer. Referring to FIG. 14, it illustrates a schematic structural view when a silicon substrate in the description is provided with a first oxide layer, an amorphous silicon layer, an organic layer and a photoresist pattern. That is, a silicon substrate 01 is provided with a first oxide layer 02, the first oxide layer 02 is provided with an amorphous silicon layer 03 covering the upper surface of the first oxide layer 02, and the upper surface of the amorphous silicon layer 03 is provided with an organic layer 04. Further, a method for forming the amorphous silicon layer 03 on the first oxide layer 02 in step 1 of the present embodiment includes depositing amorphous silicon on the first oxide layer 02 to form the amorphous silicon layer 03.

In step 2, the critical dimension of polysilicon is defined by using a mask, then photoresist is spin-coated on the organic layer, and a photoresist pattern is formed according to the critical dimension of polysilicon. Referring to FIG. 14, further, in the disclosure, the photoresist pattern 05 in step 2 of the present embodiment includes a plurality of mutually spaced strip structures.

Figure 15:
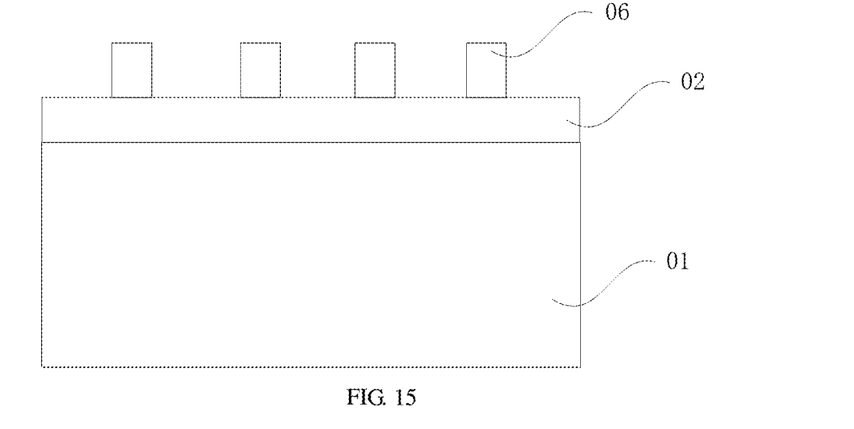

In step 3, the height and critical dimension of an amorphous silicon pattern are defined, the organic layer and the amorphous silicon layer are etched according to the photoresist pattern till the upper surface of the first oxide layer is exposed, and the amorphous silicon pattern with the defined height and critical dimension is formed. Referring to FIG. 15, it illustrates a schematic structural view of etching to form an amorphous silicon pattern. In step 3, the organic layer 04 and the amorphous silicon layer 03 are etched according to the photoresist pattern 05. An amorphous silicon pattern 06 is formed on the first oxide layer 02. The height and critical dimension of the amorphous silicon pattern satisfy the height and critical dimension defined before etching in the step. Further, in the disclosure, the organic layer on the amorphous silicon pattern 06 in step 3 of the present embodiment is completely removed, that is, after etching is performed to form the amorphous silicon pattern 06, the organic layer 04 has been completely consumed, thus forming the structure in FIG. 15.

Figure 16:
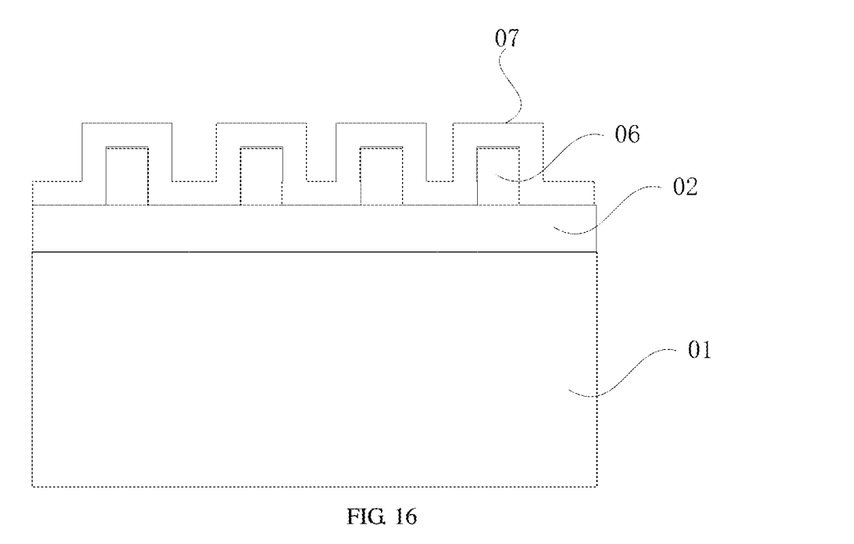

In step 4, the top and sidewalls of the amorphous silicon pattern and the exposed upper surface of the first oxide layer are covered with a first silicon nitride layer. Referring to FIG. 16, it illustrates a schematic structural view after the amorphous silicon pattern and the first oxide layer are covered with the first silicon nitride layer. Further, in the disclosure, a method for forming the first silicon nitride layer 07 in step 4 of the present embodiment is an atomic layer deposition method. That is, a first silicon nitride layer 07 is synchronously deposited on the top and sidewalls of the amorphous silicon pattern 06 and the upper surface of the first oxide layer 02 by adopting an atomic layer deposition method.

Figure 17:
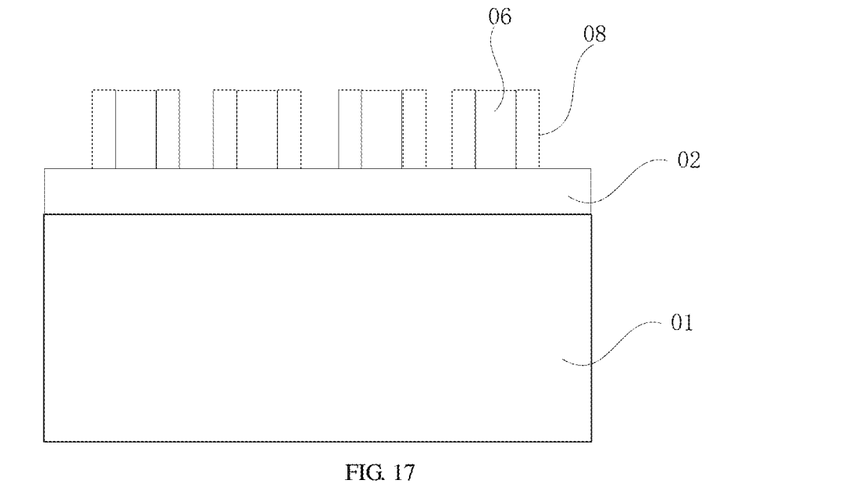

In step 5, the first silicon nitride layer on the top of the amorphous silicon pattern is etched to be removed to expose the top of the amorphous silicon pattern, and first silicon nitride sidewall patterns are formed on the sidewalls of the amorphous silicon pattern. Referring to FIG. 17, it illustrates a schematic structural view after the first silicon nitride layer at the top of the amorphous silicon pattern is removed in the disclosure. In this step, the first silicon nitride layer on the top of the amorphous silicon pattern 06 is removed by adopting an etching method, the first silicon nitride layer on the sidewalls of the amorphous silicon pattern 06 is retained, and the first silicon nitride layer attached to the sidewalls of the amorphous silicon pattern 06 forms independent structures attached to the sidewalls of the amorphous silicon pattern, namely the first silicon nitride sidewall patterns 08.

Figure 18:
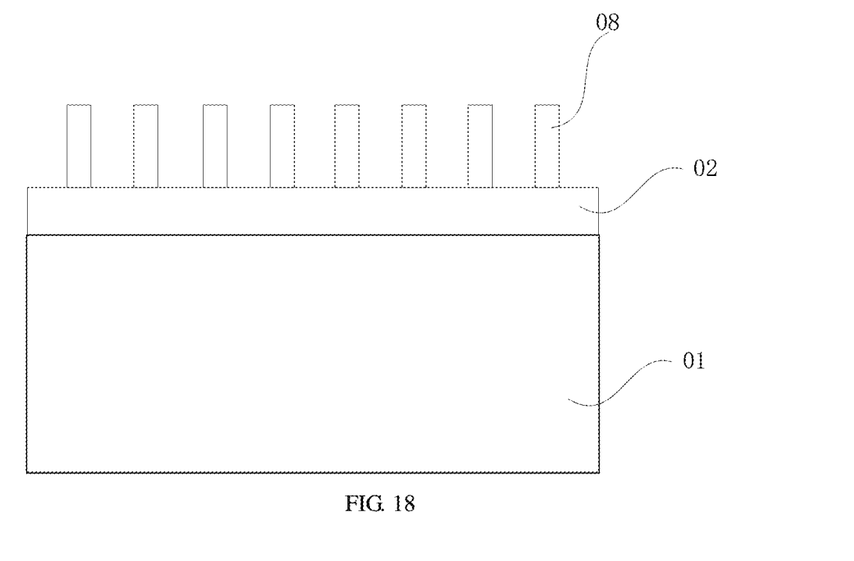

In step 6, the amorphous silicon pattern between the first silicon nitride sidewall patterns is removed. Referring to FIG. 18, it illustrates a schematic structural view after the amorphous silicon pattern is removed in the disclosure. After the amorphous silicon pattern is removed, the first silicon nitride sidewall patterns form independent structures. In the subsequent process, the self-aligned double pattern is further made according to the first silicon nitride sidewall patterns 08.

Figure 19:
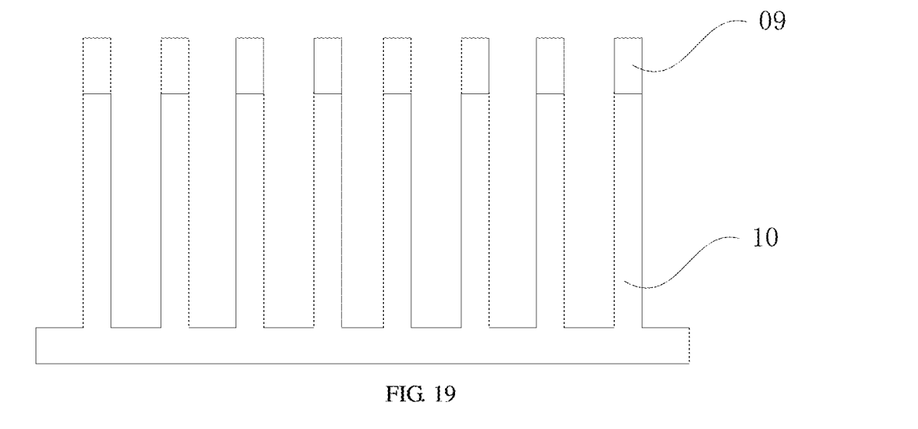

In step 7, the morphology of the fin field-effect transistor is defined, and the first oxide layer and the silicon substrate are etched along the first silicon nitride sidewall patterns to form core patterns of the silicon substrate with the defined morphology of the fin field-effect transistor and the first oxide layer pattern on the core patterns. Referring to FIG. 19, the first oxide layer 02 and the silicon substrate 01 are etched downwards along the first silicon nitride sidewall patterns 08 to form core patterns 10 in FIG. 19 and the first oxide layer pattern 09 on the core patterns 10. In step 7, after the etching is completed, the height of the core patterns is determined by the morphology of the fin field-effect transistor, and the first silicon nitride sidewall patterns 08 are completely consumed, the first oxide layer is not completely consumed, and the remaining first oxide layer forms the first oxide layer pattern 09.

Figure 20:
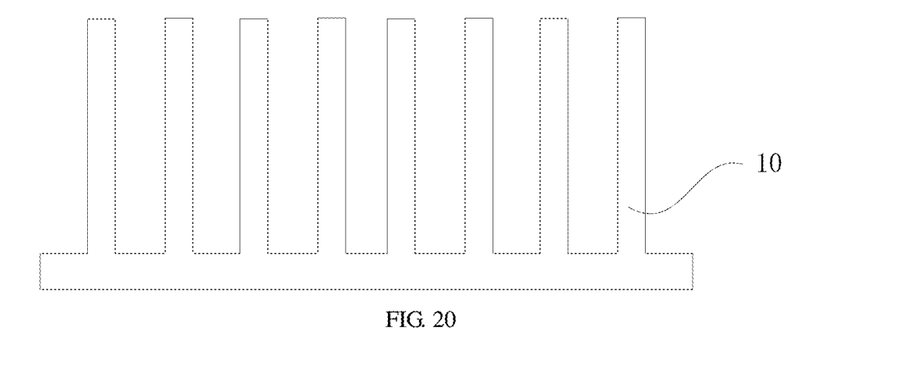

In step 8, the first oxide layer pattern is removed. Referring to FIG. 20, after the first oxide layer pattern 09 is removed, only the core patterns 10 of the silicon substrate are retained.

Figure 21:
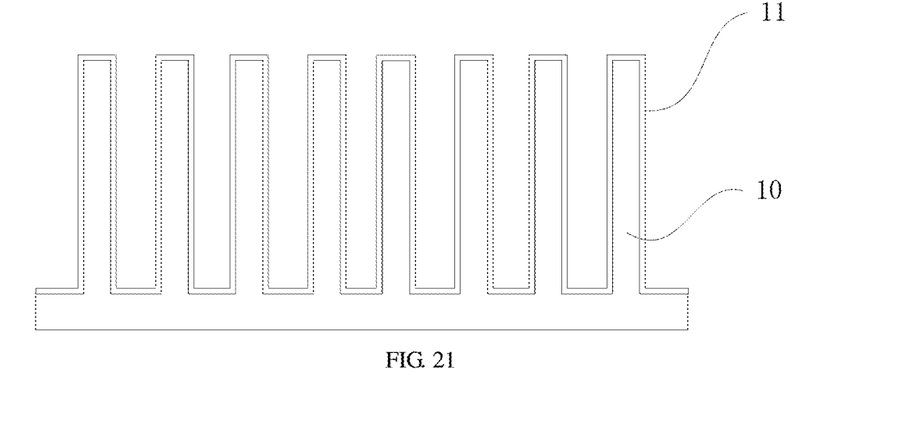

In step 9, the core patterns are covered with a thin silicon nitride layer. Specifically, a method for covering the core patterns with the thin silicon nitride layer in step 9 is an atomic layer deposition method. Referring to FIG. 21, it illustrates a schematic structural view after the core patterns are covered with the thin silicon nitride layer. In step 9, the thin silicon nitride layer 11 is deposited on the core patterns 10 by adopting an atomic layer deposition method.

Figure 22:
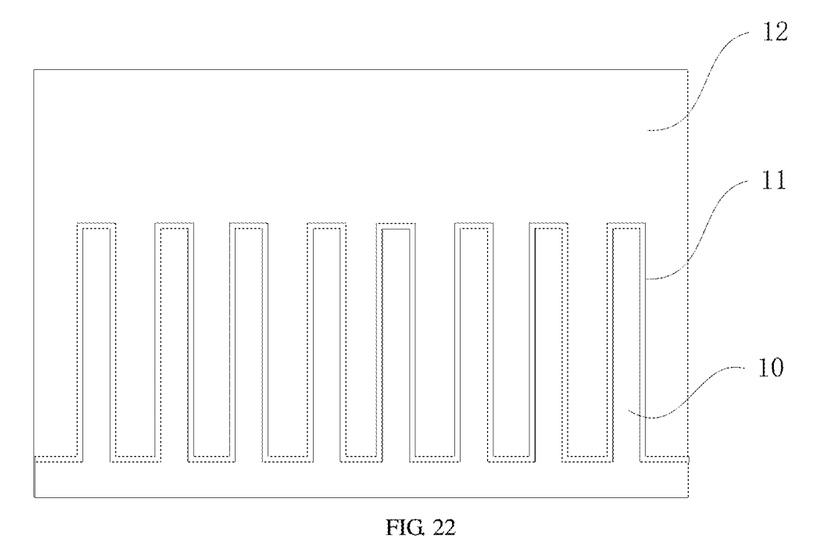
Figure 23:
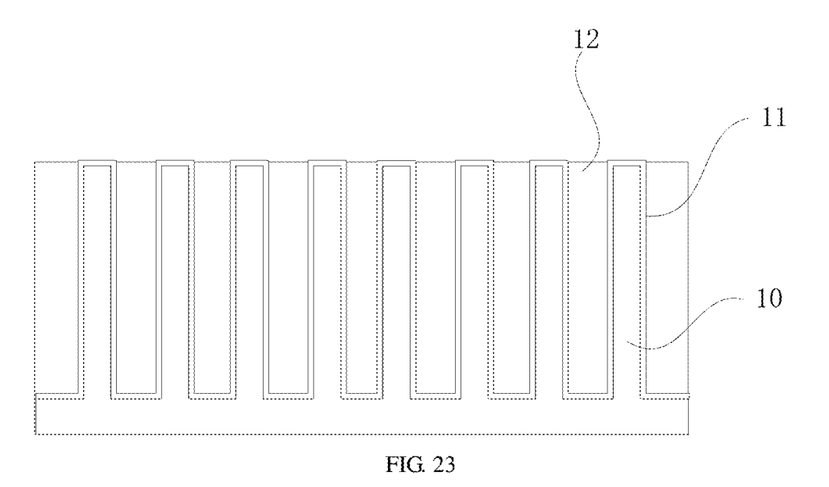

In step 10, a second oxide layer covering the thin silicon nitride layer and filling gaps between the core patterns is deposited. Specifically, in the present embodiment, a method for depositing the second oxide layer in step 10 is a chemical vapor deposition method. Referring to FIG. 22, the deposited second oxide layer 12 not only covers the surface of the thin silicon nitride layer 11, but also fills the gaps between the core patterns 10.

In step 11, the second oxide layer is polished till the thin silicon nitride layer on the top of the core patterns is exposed. Further, a method for polishing the second oxide layer in step 11 is a chemical-mechanical polishing method.

In this step, the second oxide layer 12 above the thin silicon nitride layer 11 at the top of the core patterns is polished by adopting a chemical-mechanical polishing method till the thin silicon nitride layer 11 on the top of the core patterns 10 is exposed.

Figure 24:
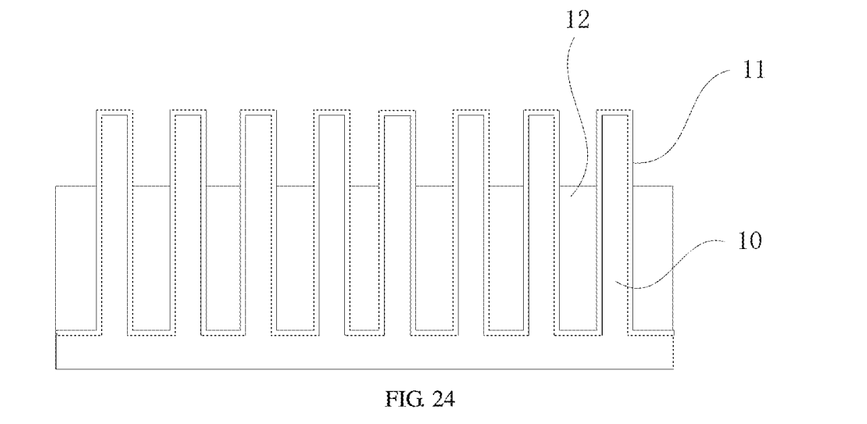

In step 12, the height of the fin field-effect transistor is defined, and the second oxide layer is etched back till the height of the exposed core patterns satisfies the defined height of the fin field-effect transistor. Referring to FIG. 24, it illustrates a schematic structural view after the second oxide layer is etched back.

Figure 25:
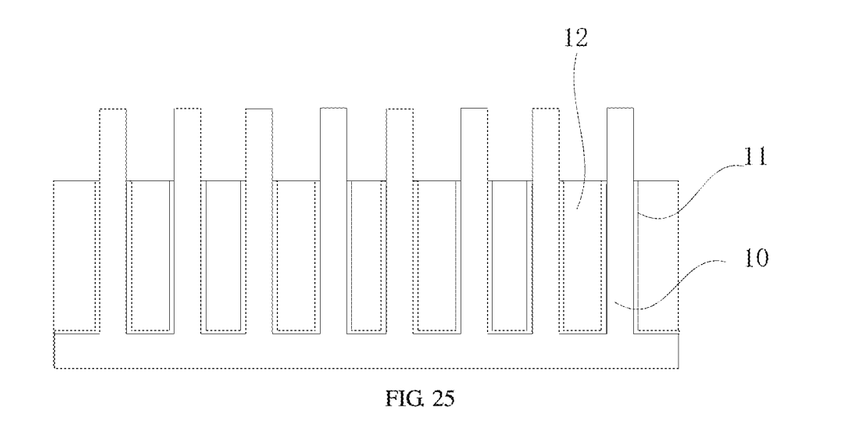

In step 13, the thin silicon nitride layer on the sidewalls and top of the exposed core patterns is removed. Further, in step 13, phosphoric acid is used to remove the thin silicon nitride layer on the sidewalls and top of the exposed core patterns. Referring to FIG. 25, it illustrates a schematic structural view after the thin silicon nitride layer on the sidewalls and top of the exposed core patterns is removed in the disclosure. After the thin silicon nitride layer on the sidewalls and top of the exposed core patterns is removed, a part of the exposed core patterns is retained.

Figure 26:
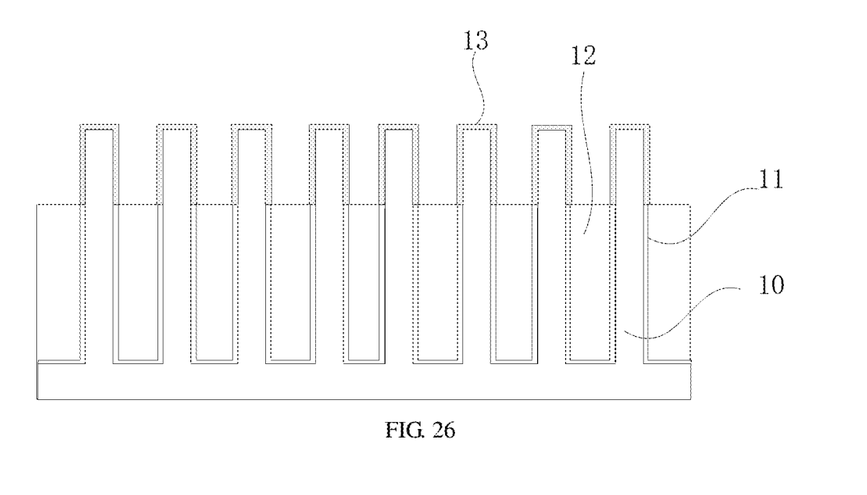

In step 14, a third oxide layer is deposited to cover the top and sidewalls of the exposed core patterns. Referring to FIG. 26, it illustrates a schematic structural view after the third oxide layer is formed on the top and sidewalls of the exposed core patterns. The third oxide layer 13 after deposited covers the top and sidewalls of the exposed core patterns, and does not fill the gaps between the exposed core patterns.

To sum up, in the method for making the self-aligned double pattern provided by the disclosure, the amorphous silicon and silicon oxide hard mask with small height is defined, the self-aligned double pattern hard mask with small height is defined, the silicon nitride stop layer is deposited through atomic deposition after the fin field-effect transistor process, and the morphology of silicon oxide and amorphous silicon is used to replace the silicon oxide/silicon nitride/silicon oxide/amorphous silicon structure in the prior art, silicon nitride deposition is performed by adopting an atomic deposition technology after the fin field-effect transistor etching process to deposit a stop layer of the chemical-mechanical polishing process to replace original silicon nitride deposition as a stop layer before the core etching process, the photoresist gap filling process window is added, and the self-aligned double pattern making process is effectively simplified. Therefore, the disclosure effectively overcomes various disadvantages in the prior art, and thus has a great industrial utilization value.

The above embodiments are used for describing the principle and effect of the disclosure only, instead of limiting the disclosure. Those skilled in the art may modify or change the above embodiments without going beyond the spirit and scope of the disclosure. Therefore, all equivalent modifications or changes made by those skilled in the art without departing from the spirit and technical concept disclosed in the disclosure shall still be covered by the claims of the disclosure.

What is claimed is:

1. A method for making a self-aligned double pattern, wherein the method for making the self-aligned double pattern at least comprises the following steps:
   step 1: providing a silicon substrate, the silicon substrate being provided with a first oxide layer; the first oxide layer being provided with an amorphous silicon layer; and the amorphous silicon layer being provided with an organic layer;

step 2: defining a critical dimension of polysilicon, then spin-coating photoresist on the organic layer, and forming a photoresist pattern according to the critical dimension of polysilicon;

step 3: defining a height and a critical dimension of an amorphous silicon pattern, etching the organic layer and the amorphous silicon layer according to the photoresist pattern till an upper surface of the first oxide layer is exposed, and forming the amorphous silicon pattern with the defined height and the critical dimension of the amorphous silicon pattern;

step 4: covering a top and sidewalls of the amorphous silicon pattern and the exposed upper surface of the first oxide layer with a first silicon nitride layer;

step 5: etching to remove the first silicon nitride layer on the top of the amorphous silicon pattern to expose the top of the amorphous silicon pattern, and forming first silicon nitride sidewall patterns on the sidewalls of the amorphous silicon pattern;

step 6: removing the amorphous silicon pattern between the first silicon nitride sidewall patterns;

step 7: defining a morphology of a fin field-effect transistor, and etching the first oxide layer and the silicon substrate along the first silicon nitride sidewall patterns to form core patterns of the silicon substrate with the defined morphology of the fin field-effect transistor and a first oxide layer pattern on the core patterns;

step 8: removing the first oxide layer pattern;

step 9: covering the core patterns with a second silicon nitride layer;

step 10: depositing a second oxide layer covering the second silicon nitride layer and filling gaps between the core patterns;

step 11: polishing the second oxide layer till the second silicon nitride layer on a top of the core patterns is exposed;

step 12: defining a height of the fin field-effect transistor, and etching back the second oxide layer till a height of exposed core patterns satisfies the defined height of the fin field-effect transistor;

step 13: removing the second silicon nitride layer on sidewalls and the exposed top of the core patterns; and step 14: depositing a third oxide layer to cover the sidewalls and the exposed top of the core patterns.

2. The method for making the self-aligned double pattern according to claim 1, wherein the first oxide layer provided on the silicon substrate in step 1 is a silicon oxide layer, and a method for forming the silicon oxide layer comprises oxidizing the upper surface of the silicon substrate to form the silicon oxide layer.

3. The method for making the self-aligned double pattern according to claim 1, wherein the photoresist pattern in step 2 comprises a plurality of mutually spaced strip structures.

4. The method for making the self-aligned double pattern according to claim 1, wherein the organic layer on the amorphous silicon pattern in step 3 is completely removed.

5. The method for making the self-aligned double pattern according to claim 1, wherein a method for forming the first silicon nitride layer in step 4 is an atomic layer deposition method.

6. The method for making the self-aligned double pattern according to claim 1, wherein a method for covering the core patterns with the second silicon nitride layer in step 9 is an atomic layer deposition method.

7. The method for making the self-aligned double pattern according to claim 1, wherein a method for depositing the second oxide layer in step 10 is a chemical vapor deposition method.

8. The method for making the self-aligned double pattern according to claim 1, wherein a method for polishing the second oxide layer in step 11 is a chemical-mechanical polishing method.

9. The method for making the self-aligned double pattern according to claim 1, wherein in step 13, phosphoric acid is used to remove the second silicon nitride layer on the sidewalls and the exposed top of the core patterns.

* * * * *